(12) United States Patent
Hsu et al.

(10) Patent No.: US 11,451,222 B2
(45) Date of Patent: Sep. 20, 2022

(54) RELIABILITY DETECTION DEVICE AND RELIABILITY DETECTION METHOD

(71) Applicant: REALTEK SEMICONDUCTOR CORPORATION, Hsinchu (TW)

(72) Inventors: Wen-Hsuan Hsu, Hsinchu (TW); Chun-Yi Kuo, Hsinchu (TW); Ying-Yen Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/542,518

(22) Filed: Dec. 6, 2021

(65) Prior Publication Data

US 2022/0247399 A1 Aug. 4, 2022

(30) Foreign Application Priority Data

Feb. 1, 2021 (TW) .................................. 110103644

(51) Int. Cl.
*H03K 17/00* (2006.01)
*H03K 19/003* (2006.01)

(52) U.S. Cl.
CPC ......... *H03K 17/005* (2013.01); *H03K 19/003* (2013.01); *H03K 2217/94* (2013.01)

(58) Field of Classification Search
None
See application file for complete search history.

(56) References Cited

U.S. PATENT DOCUMENTS

| | | | |
|---|---|---|---|
| 2012/0274310 A1* | 11/2012 | Chen | G01R 31/2884 324/76.39 |
| 2017/0025946 A1* | 1/2017 | Jeong | H02M 3/07 |
| 2017/0089975 A1* | 3/2017 | Savoj | G01R 35/005 |
| 2021/0099180 A1* | 4/2021 | Narita | H03K 3/023 |

* cited by examiner

*Primary Examiner* — Tuan T Lam
(74) *Attorney, Agent, or Firm* — WPAT, PC

(57) ABSTRACT

A reliability detection device includes a control circuit, oscillator circuits, and an output circuit. The control circuit is configured to generate enable signals according to a mode signal. The oscillator circuits output oscillating signals, in which each of the oscillator circuits is configured to generate a corresponding oscillating signal in the oscillating signals according to a switching signal when the mode signal has a first logic value, and generate the corresponding oscillating signal according to a corresponding enable signal in the enable signals when the mode signal has a second logic value, and the switching signal is associated with a functional circuit. The output circuit is configured to output a detection signal according to the oscillating signals when the mode signal has the second logic value, in which the detection signal is to indicate a reliability of the functional circuit.

20 Claims, 4 Drawing Sheets

RELIABILITY DETECTION DEVICE AND RELIABILITY DETECTION METHOD

BACKGROUND OF THE INVENTION

1. Field of the Invention

The present disclosure relates to a reliability detection device for circuits. More particularly, the present disclosure relates to a reliability detection device having oscillator circuit(s) and a reliability detection method.

2. Description of Related Art

As the running time becomes longer, an integrated circuit may be degraded (or aged) due to some non-ideal factors. For example, negative-bias temperature instability may cause a threshold voltage of a P-type transistor to be higher. If the threshold voltage of the P-type transistor increases, errors may be caused in original operation(s) of the integrated circuit, or the performance of the integrated circuit may degrade. In some related approaches, an oscillator circuit is configured to detect the performance of the integrated circuit, in order to check whether the reliability of components in the integrated circuit are in a normal range. However, in the above approaches, the oscillator circuit may be turned off due to a power-saving mechanism or may be over-switched, which results in an inaccurate detection result.

SUMMARY

In some aspects, a reliability detection device includes a control circuit, oscillator circuits, and an output circuit. The control circuit is configured to generate enable signals according to a mode signal. The oscillator circuits are configured to output oscillating signals, in which each of the oscillator circuits is configured to generate a corresponding oscillating signal in the oscillating signals according to a switching signal when the mode signal has a first logic value, and generate the corresponding oscillating signal according to a corresponding enable signal in the enable signals when the mode signal has a second logic value, and the switching signal is associated with a functional circuit. The output circuit is configured to output a detection signal according to the oscillating signals when the mode signal has the second logic value, in which the detection signal is to indicate a reliability of the functional circuit.

In some aspects, a reliability detection method includes the following operations: generating enable signals according to a mode signal; generating oscillating signals according to a switching signal when the mode signal has a first logic value, in which the switching signal is associated with a functional circuit; generating a corresponding oscillating signal in the oscillating signals according to a corresponding enable signal in the enable signals when the mode signal has a second logic value; and outputting a detection signal according to the plurality of oscillating signals when the mode signal has the second logic value, in which the detection signal is to indicate a reliability of the functional circuit.

These and other objectives of the present disclosure will be described in preferred embodiments with various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
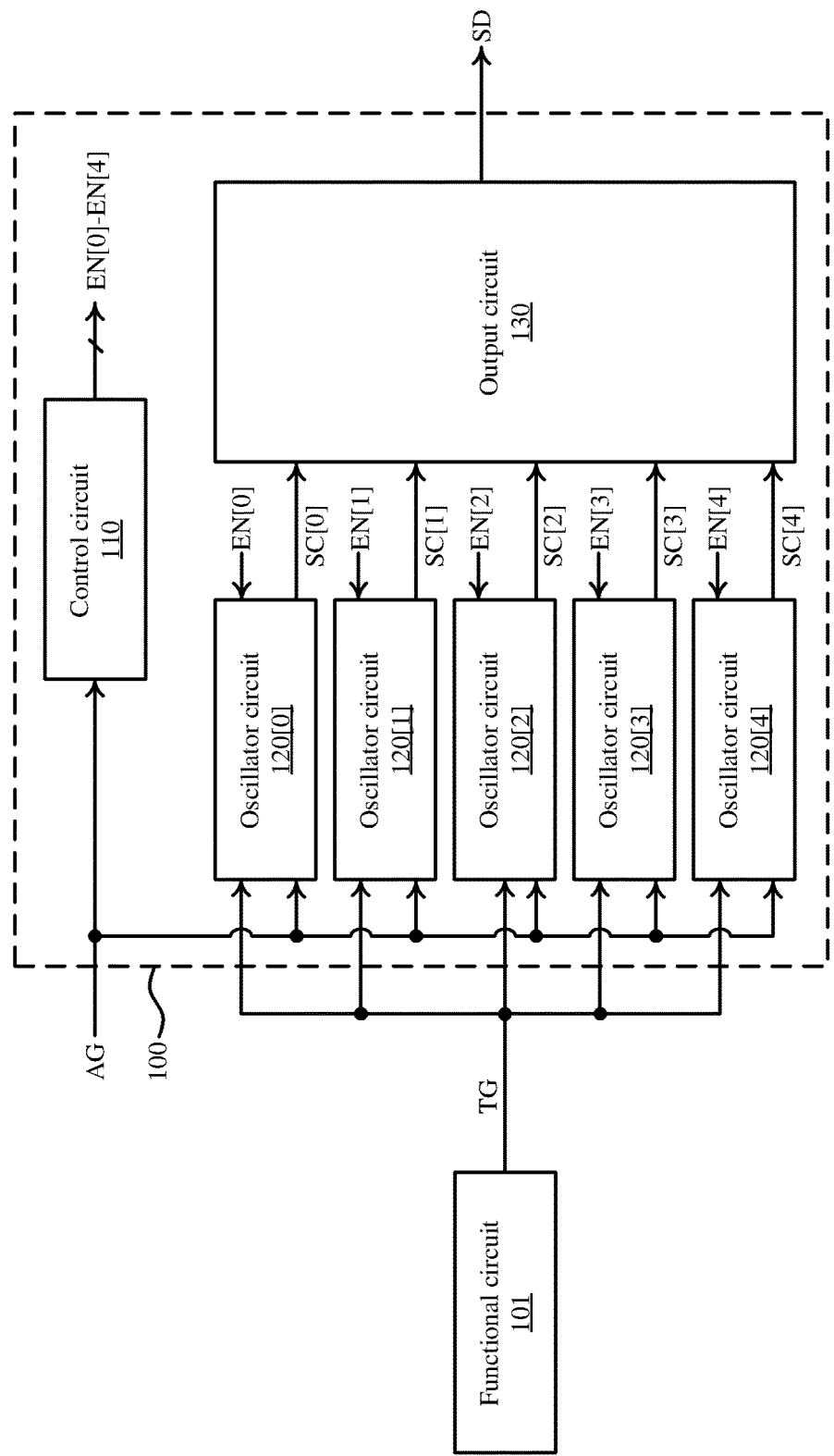
FIG. 1 is a schematic diagram of a reliability detection device according to some embodiments of the present disclosure.

FIG. 1 is a schematic diagram of a reliability detection device 100 according to some embodiments of the present disclosure. In some embodiments, a functional circuit 101 may be (but not limited to) a digital signal processor circuit, an application-specific integrated circuit, and so on. In practical applications, the functional circuit 101 may be degraded (or aged) due to longer operating time. In some embodiments, the reliability detection device 100 and the functional circuit 101 may be integrated into a single system, and the reliability detection device 100 can be configured to detect the degradation (or the degree of aging) of the functional circuit 101.

The reliability detection device 100 includes a control circuit 110, oscillator circuits 120[0]-120[4], and an output circuit 130. The control circuit 110 is configured to generate enable signals EN[0]-EN[4] according to a mode signal AG. For example, when the mode signal AG has a first logic value (e.g., a logic value of 1), all enabling signals EN[0]-EN[4] have a second logic value (e.g., a logic value of 0), in which the first logic value is the complement of the second logic value (e.g., the logic value is either 1 or 0). Alternatively, when the mode signal AG has the second logic value, one of the enable signals EN[0]-EN[4] may have the first logic value, but the combinations of generating the enable signals EN[0]-EN[4] with the mode signal AG are not limited thereto.

The oscillator circuits 120[0]-120[4] are configured to output oscillating signals SC[0]-SC[4]. When the mode signal AG has the first logic value (e.g., the logic value of 1), each of the oscillator circuits 120[0]-120[4] is configured to generate a corresponding oscillating signal in the oscillating signals SC[0]-SC[4] according to a switching signal TG. In some embodiments, the switching signal TG is associated with the functional circuit 101. For example, the switching signal TG may be an output signal from the functional circuit 101, an internal signal of the functional circuit 101, or a signal generated based on a signal from the functional circuit 101. In some embodiments, the switching signal TG may be utilized to indicate an average toggle rate of the functional circuit 101. With the above operations, when the mode signal AG has the first logic value, the oscillator circuits 120[0]-120[4] are switched with the functional circuit 101. As a result, the degradation of the oscillator circuits 120[0]-120[4] may be close to that of the functional circuit 101, in order to generate a more accurate detection result.

Alternatively, when the mode signal AG has the second logic value (e.g., the logic value of 0), each of the oscillator circuits 120[0]-120[4] is configured to generate a corresponding oscillating signal in the oscillating signals SC[0]-SC[4] according to a corresponding enable signal in the enable signals EN[0]-EN[4]. In other words, the mode signal AG has the second logic value, each oscillator circuit 120[0]-120[4] does not generate the corresponding oscillating signal in response to the switching signal TG. With the above operations, when the mode signal AG has the second logic value, each of the oscillator circuits 120[0]-120[4] may operate as a free running oscillator circuit according to the corresponding enable signal, in order to generate the corresponding oscillating signal. Under this condition, the oscillating signals SC[0]-SC[4] can be configured to indicate the degradation of the functional circuit 101.

The output circuit 130 is configured to output a detection signal SD according to the oscillating signals SC[0]-SC[4] when the mode signal AG has the second logic value. In some embodiments, the detection signal SD may be configured to indicate the reliability of the functional circuit 101. In some embodiments, when the mode signal AG has the first logic value, the output circuit 130 stops outputting the detection signal SD. In other words, the switching of the output circuit 130 can be stopped when the mode signal AG has the first logic value. As a result, the power consumption can be lower and the output circuit 130 can be prevented from being degraded, in order to increase the detection accuracy.

In some embodiments, the reliability detection device 100 may further include a processing circuit (not shown). In an initial boot of the reliability detection device 100, the mode signal AG is set at the second logic value. In response to the mode signal AG, the oscillator circuits 120[0]-120[4] may sequentially generate the oscillating signals SC[0]-SC[4] in response to the enable signals EN[0]-EN[4]. For example, when the enable signal EN[0] has the second logic value, the remaining enable signals EN[1]-EN[4] have the first logic values. Under this condition, the oscillator circuit 120[0] may generate the corresponding oscillating signal SC[0], and the oscillator circuits 120[1]-120[4] do not generate the oscillating signals SC[1]-SC[4]. The output circuit 130 may generate the corresponding detection signal SD based on the oscillating signal SC[0]. Afterwards, the processing circuit may start counting according to this detection signal SD, in order to generate a predetermined value corresponding to the oscillator circuit 120[0], and store the predetermined value to a register circuit (not shown). With this analogy, during the initial boot of the reliability detection device 100, the processing circuit may store the predetermined values respectively corresponding to the oscillator circuits 120[0]-120[4].

In subsequent detecting operations, the processing circuit may generate a new count value according to the detection signal SD, and compare the count value with the corresponding predetermined value to verify the reliability of the functional circuit 101. For example, the frequency of the oscillating signals SC[0]-SC[4] may be slower due to degradation of circuits, such that the new count value is smaller. If the count value is less than the corresponding predetermined value, it indicates that the performance of the functional circuit 101 is degraded. In some embodiments, the processing circuit may compare the count value with a threshold value, and send a warning message when the count value is smaller than the threshold value. The warning message is to notify a user or other calibration circuit that the performance of the functional circuit 101 is considerably low, in order to apply a subsequent replacement or calibration. In some embodiments, the processing circuit may be implemented with a processor circuit. For example, the above operations may be implemented by using the processor circuit to execute software, but the present disclosure is not limited thereto.

In some related approaches, in order to save power consumption, the oscillator circuit is turned off when the functional circuit performs normal operation(s). As a result, the degree of degradation of the oscillator circuit is different from that of the functional circuit, and thus the accurate detection result cannot be obtained. Alternatively, in some related approaches, the oscillator circuit is configured to be switched continuously. If the oscillator circuit is over-switched, the degree of degradation of the oscillator circuit may be higher than that of the functional circuit, and thus the accurate detection result cannot be obtained.

Compared with the above approaches, in some embodiments of the present disclosure, when the mode signal AG has the first logic value, the oscillator circuits 120[0]-120[4] are switched with the switching signal TG from the functional circuit 101. As a result, it can be assured that the degree of degradation of the oscillator circuits 120[0]-120[4] is close to that of the functional circuit 101. Furthermore, as mentioned above, the output circuit 130 is turned off when the mode signal AG has the first logic value, in order to assure that the output circuit 130 cannot be switched by the oscillator circuits 120[0]-120[4] to increase the detection accuracy.

Figure 2:
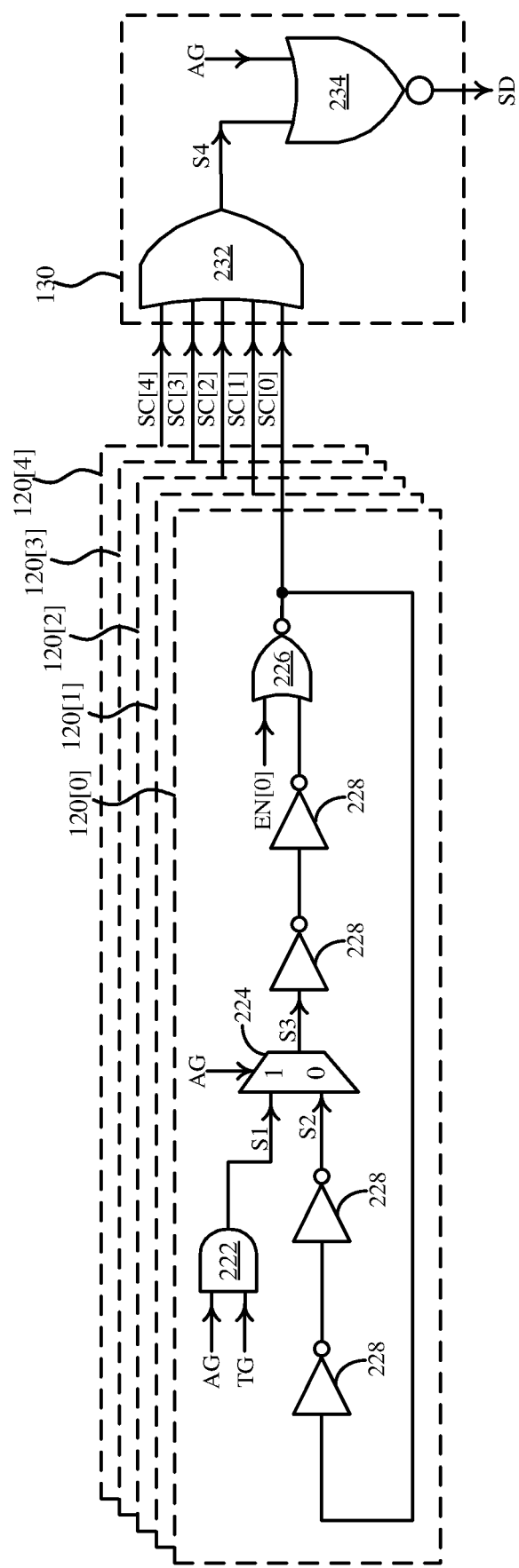
FIG. 2 is a schematic diagram of the oscillator circuits and the output circuit in FIG. 1 according to some embodiments of the present disclosure.

FIG. 2 is a schematic diagram of the oscillator circuits 120[0]-120[4] and the output circuit 130 in FIG. 1 according to some embodiments of the present disclosure. Circuit architecture of each oscillator circuit 120[0]-120[4] is the same as each other. Taking the architecture of the oscillator circuit 120[0] in FIG. 2 as an example, the oscillator circuit 120[0] includes a logic gate circuit 222, a multiplexer circuit 224, a logic gate circuit 226, and digital circuits 228. The logic gate circuit 222 generates a signal S1 according to the mode signal AG and the switching signal TG. When the mode signal AG has the first logic value, the logic gate circuit 222 outputs the switching signal TG to be the signal S1. Alternatively, when the mode signal AG has the second logic value, the logic gate circuit 222 outputs the signal S1 having a fixed level (e.g., a low level). In this example, the logic gate circuit 222 may be (but not limited to) an AND gate circuit. The multiplexer circuit 224 is configured to output the signal S1 or a signal S2 to be a signal S3 according to the mode signal AG. For example, if the mode signal AG has the first logic value, the multiplexer circuit 224 outputs the signal S1 to be the signal S3. Alternatively, if the mode signal AG has the second logic value, the multiplexer circuit 224 outputs the signal S2 to be the signal S3.

The logic gate circuit 226 is configured to generate a corresponding oscillating signal SC[0] according to the corresponding enable signal EN[0] and the signal S3. For example, the logic gate circuit 226 may be (but not limited to) a NOR gate circuit. The digital circuits 228 are configured to output the signal S2 and receive the signal S3. In greater detail, the digital circuits 228 are coupled in series via the multiplexer circuit 224 and the logic gate circuit 226, in order to operate as a ring oscillator circuit. When the enable signal EN[0] has the second logic value, the ring oscillator circuit generates the oscillating signal SC[0] based on the signal S2. For example, when the enable signal EN[0] has the second logic value, the ring oscillator circuit operates as a free running oscillator circuit that is started switching based on the signal S2 to generate the oscillating signal SC[0]. Alternatively, when the enable signal EN[0] has the first logic value, the output terminal of the logic gate circuit 226 has a fixed level (e.g., a low level). Equivalently, the ring oscillator circuit stops generating the oscillating signal SC[0] in response to the enable signal EN[0] having the first logic value. As a result, it is able to prevent the oscillator circuits 120[0]-120[4] from being switched, in order to lower the degradation of the output circuit 130.

As mentioned above, each of the oscillator circuits 120[0]-120[4] has the same circuit architecture. For example, in the oscillator circuit 120[1], the logic gate circuit 226 receives the enable signals EN[1] and generates the corresponding oscillating signal SC[1]. With this analogy, the arrangements of each of the oscillator circuits 120[0]-120[4] can be understood.

In examples of FIG. 2, the digital circuits 228 are inverter circuits, but the present disclosure is not limited thereto. In some embodiments, the arrangements of the digital circuits 228 may be determined based on the functional circuit 101. For example, if the functional circuit 101 includes a AND gate circuit, an OR gate circuit, an inverter circuit, and an NAND gate circuit, the digital circuits 228 may be implemented with the same combination of the AND gate circuit, the OR gate circuit, the inverter circuit, and the NAND gate circuit. As a result, a more accurate detection result of the reliability can be obtained. The kinds of the circuits included in the functional circuit 101 are given for illustrative purposes, and the present disclosure is not limited thereto.

In some embodiments, a number of times for the signal S2 being inverted by the digital circuits 228 and the logic gate circuit 226 may set to be an odd number, in order to assure that the oscillator circuits 120[0]-120[4] are able to start oscillating properly. In other words, in some embodiments, in each oscillator circuit 120[0]-120[4], a number of the digital circuits 228 and the logic gate circuit 226 may be an odd number. In examples of FIG. 2, the oscillator circuit 120[0] includes four digital circuits 228 and one logic gate circuit 226. As a result, the signal S2 is inverted by five times, in order to generate the oscillating signal SC[0]. Alternatively, in some other embodiments, the oscillator circuit 120[0] includes fifty digital circuits 228 and one logic gate circuit 226. As a result, the signal S2 is inverted by fifty-one times, in order to generate the oscillating signals SC[0]. The numbers of the digital circuits 228 and the logic gate circuit 226 are given for illustrative purposes, and the present disclosure is not limited thereto.

The output circuit 130 includes a logic gate circuit 232 and a logic gate circuit 234. The logic gate circuit 232 is coupled to the oscillator circuits 120[0]-120[4] to receive the oscillating signals SC[0]-SC[4]. The logic gate circuit 232 is configured to generate a signal S4 according to the oscillating signals SC[0]-SC[4]. As mentioned above, when a corresponding one of the enable signals EN[0]-EN[4] has the second logic value, the remaining signals in the enable signals EN[0]-EN[4] have the first logic values. Under this condition, the logic gate circuit 232 may output a corresponding one of the oscillating signals SC[0]-SC[4] to be the signal S4.

For example, when the enable signal EN[0] has the second logic value, the remaining enable signals EN[1]-EN[4] have the first logic values. Under this condition, the oscillator circuit 120[0] starts switching based on the signal S2 to generate the oscillating signal SC[0], and the remaining oscillator circuits 120[1]-120[4] output the oscillating signals SC[1]-SC[4] having a fixed level (e.g., a low level). Accordingly, the logic gate circuit 232 may output the oscillating signal SC[0] to be the signal S4. In this example, the logic gate circuit 232 may be, but not limited to, an OR gate circuit.

The logic gate circuit 234 is coupled to the logic gate circuit 232 to receive the signal S4. When the mode signal AG has the second logic value, the logic gate circuit 234 outputs the detection signal SD according to the signal S4. When the mode signal AG has the first logic value, the logic gate circuit 234 stops outputting the detection signal SD. For example, the logic gate circuit 234 may be, but not limited to, an NOR gate circuit. When the mode signal AG has the first logic value, an output terminal of the logic gate circuit 234 is fixed at a low level. Equivalently, the logic gate circuit 234 stops outputting the detection signal SD in response to the mode signal AG having the first logic value. As result, the output circuit 130 is able to be not switched by the oscillator circuits 120[0]-120[4].

Figure 3:
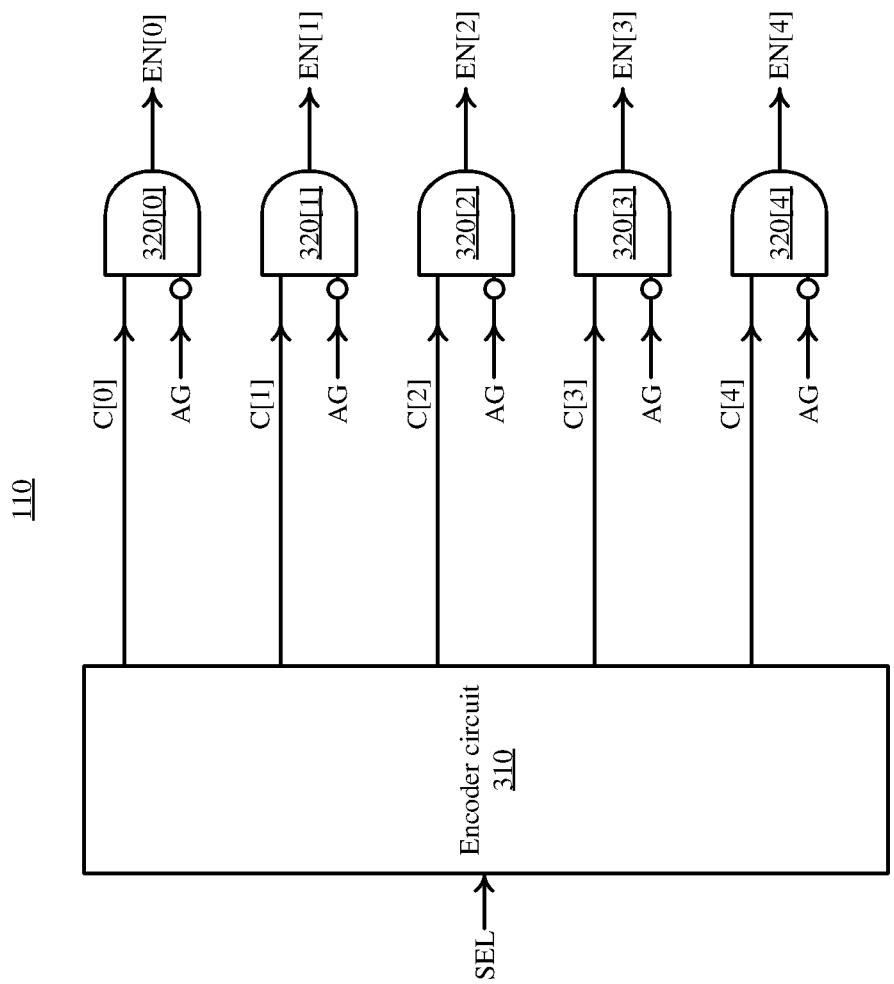
FIG. 3 is a schematic diagram of the control circuit in FIG. 1 according to some embodiments of the present disclosure.

FIG. 3 is a schematic diagram of the control circuit 110 in FIG. 1 according to some embodiments of the present disclosure. In some embodiments, the control circuit 110 includes an encoder circuit 310 and logic gate circuits 320[0]-320[4]. The encoder circuit 310 is configured to generate control signals C[0]-C[4] according to a selection signal SEL, in which the selection signal SEL is for selecting one of the oscillator circuits 120[0]-120[4] to detect the reliability of the functional circuit 101. The logic gate circuits 320[0]-320[4] receive the control signals C[0]-C[4] respectively, and receive the mode signal AG. The logic gate circuits 320[0]-320[4] generate the enable signals EN[0]-EN[4] according to the control signals C[0]-C[4] and the mode signal AG. For example, the logic gate circuit 320[0] generates the enable signal EN[0] according to the control signal C[0] and the mode signal AG. With this analogy, the corresponding relations among the other logic circuits 320[1]-320[4], the control signals C[0]-C[4], and the enable signals EN[1]-EN[4] can be understood.

When the mode signal AG has the first logic value, the logic gate circuits 320[0]-320[4] output the enable signals EN[0]-EN[4] having the second logic values. When the mode signal AG has the second logic value, the logic gate circuits 320[0]-320[4] outputs the control signals C[0]-C[4] to be the enable signals EN[0]-EN[4] respectively. For example, each of the logic gate circuits 320[0]-320[4] can be an AND gate circuit having an inverting input terminal, in which the inverting input terminal is configured to receive the mode signal AG.

It is understood that, the number of circuits shown in FIG. 1, FIG. 2, and/or FIG. 3 are given for illustrative purposes, and the present disclosure is not limited thereto. For example, in some other embodiments, the reliability detection device 100 may include a different number of the oscillator circuits.

Figure 4:
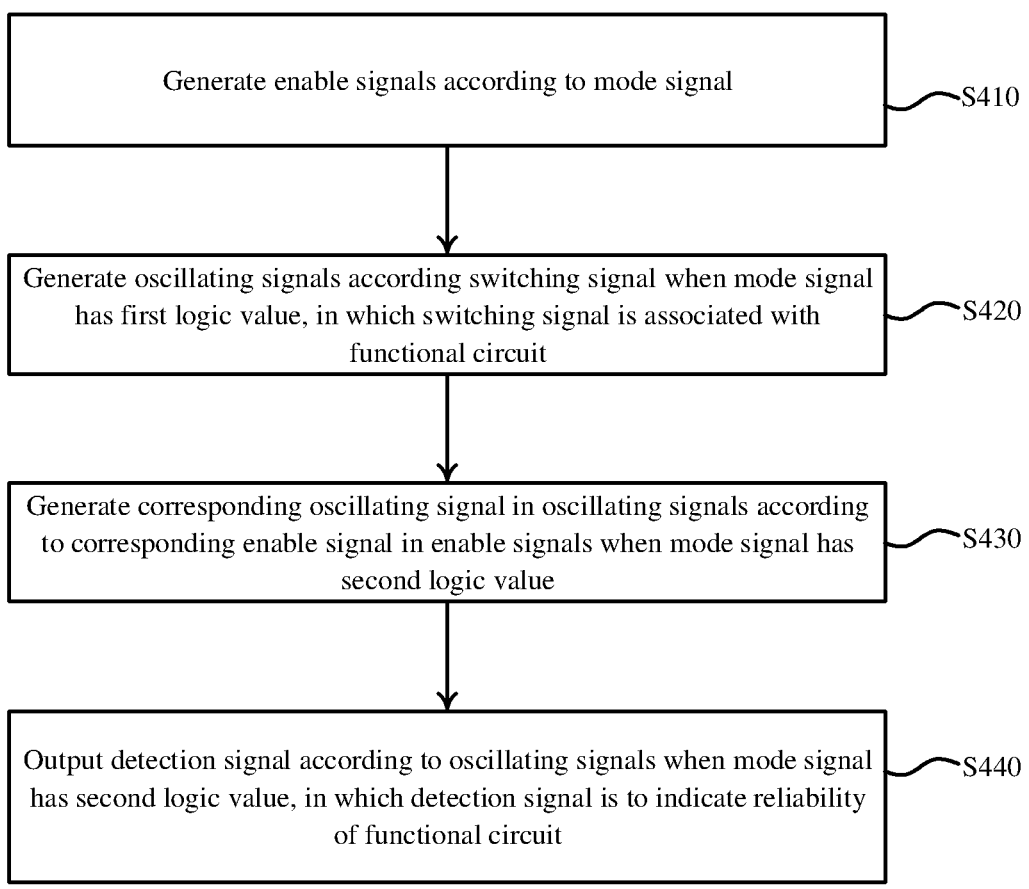
FIG. 4 is a flow chart of a reliability detection method according to some embodiments of the present disclosure.

FIG. 4 is a flow chart of a reliability detection method 400 according to some embodiments of the present disclosure. In some embodiments, the reliability detection method 400 may be, but not limited to, performed by the reliability detection device 100 in FIG. 1.

In operation S410, enable signals (e.g., the enable signals EN[0]-EN[4] in FIG. 1) are generated according to a mode signal (e.g., the mode signal AG in FIG. 1). In operation S420, when the mode signal has a first logic value (e.g., a logic value of 1), oscillating signals (e.g., the oscillating signals SC[0]-SC[4] in FIG. 1) are generated according to a switching signal (e.g., the switching signal TG in FIG. 1), in which the switching signal is associated with a functional circuit (e.g., the functional circuit 101 in FIG. 1). In operation S430, when the mode signal has a second logic value, generate a corresponding oscillating signal of the oscillating signals according to a corresponding enable signal in the enable signals. In operation S440, when the mode signal has the second logic value, a detection signal (e.g., the detection signal SD in FIG. 1) is outputted, in which the detection signal is to indicate a reliability of the functional circuit.

The above operations can be understood with reference to the above embodiments, and thus the repetitious descriptions are not further given. The above description of the reliability detection method 400 includes exemplary operations, but the operations are not necessarily performed in the order described above. Operations of the reliability detection method 400 may be added, replaced, changed order, and/or eliminated as appropriate, or the operations are able to be executed simultaneously or partially simultaneously as appropriate, in accordance with the spirit and scope of various embodiments of the present disclosure.

As described above, the reliability detection device and the reliability detection method are able to set the degradation of the oscillator circuit(s) to be close to degradation of the functional circuit, and is able to lower the degradation of other control circuit(s). As a result, a more accurate reliability detection result can be obtained.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A reliability detection device, comprising:
   a control circuit configured to generate a plurality of enable signals according to a mode signal;
   a plurality of oscillator circuits configured to output a plurality of oscillating signals, wherein each of the plurality of oscillator circuits is configured to generate a corresponding oscillating signal in the plurality of oscillating signals according to a switching signal when the mode signal has a first logic value, and generate the corresponding oscillating signal according to a corresponding enable signal in the plurality of enable signals when the mode signal has a second logic value, and the switching signal is associated with a functional circuit; and
   an output circuit configured to output a detection signal according to the plurality of oscillating signals when the mode signal has the second logic value, wherein the detection signal is to indicate a reliability of the functional circuit.

2. The reliability detection device of claim 1, wherein when the mode signal has the second logic value, each of the plurality of oscillator circuits is configured to operate as a free running oscillator circuit according to the corresponding enable signal, in order to generate the corresponding oscillating signal.

3. The reliability detection device of claim 1, wherein the mode signal has the second logic value, each of the plurality of oscillator circuits does not generate the corresponding oscillating signal in response to the switching signal.

4. The reliability detection device of claim 1, wherein the output circuit is further configured to stop outputting the detection signal when the mode signal has the first logic value.

5. The reliability detection device of claim 1, wherein each of the plurality of oscillator circuits comprises:
   a first logic gate circuit configured to generate a first signal according to the mode signal and the switching signal;
   a multiplexer circuit configured to output the first signal or a second signal to be a third signal according to the mode signal;
   a second logic gate circuit configured to generate the corresponding oscillating signal according to the corresponding enable signal and the third signal; and
   a plurality of digital circuits configured to output the second signal and receive the third signal, wherein the plurality of digital circuits are coupled in series via the multiplexer circuit and the second logic gate circuit, in order to operate as a ring oscillator circuit.

6. The reliability detection device of claim 5, wherein when the corresponding enable signal has the second logic value, the ring oscillator circuit generates the corresponding oscillating signal based on the second signal.

7. The reliability detection device of claim 5, wherein the first logic gate circuit is an AND gate circuit.

8. The reliability detection device of claim 5, wherein the second logic gate circuit is an NOR gate circuit.

9. The reliability detection device of claim 1, wherein the control circuit comprises:

an encoder circuit configured to generate a plurality of control signals according to a selection signal; and a plurality of logic gate circuits configured to generate the plurality of enable signals according to the plurality of control signals and the mode signal, wherein when the mode signal has the first logic value, each of the plurality of enable signals has the second logic value.

10. The reliability detection device of claim 9, wherein each of the plurality of logic gate circuits is an AND gate circuit having an inverting input terminal, and the inverting input terminal is configured to receive the mode signal.

11. The reliability detection device of claim 1, wherein the output circuit comprises:

a first logic gate circuit configured to generate a signal according to the plurality of oscillating signals; and a second logic gate circuit configured to output the detection signal according to the signal when the mode signal has the second logic value, and stop outputting the detection signal when the mode signal has the first logic value.

12. The reliability detection device of claim 11 wherein the first logic gate circuit is an OR gate circuit.

13. The reliability detection device of claim 11, wherein the second logic gate circuit is an NOR gate circuit.

14. A reliability detection method, comprising:

generating a plurality of enable signals according to a mode signal;

generating a plurality of oscillating signals according to a switching signal when the mode signal has a first logic value, wherein the switching signal is associated with a functional circuit;

generating a corresponding oscillating signal in the plurality of oscillating signals according to a corresponding enable signal in the plurality of enable signals when the mode signal has a second logic value; and outputting a detection signal according to the plurality of oscillating signals when the mode signal has the second logic value, wherein the detection signal is to indicate a reliability of the functional circuit.

15. The reliability detection method of claim 14, wherein the plurality of oscillating signals are generated from a plurality of oscillating circuits, and generating the corresponding oscillating signal according to the corresponding enable signal when the mode signal has the second logic value comprises:

operating, by a corresponding one of the plurality of oscillator circuits, as a free running oscillator circuit according to the corresponding enable signal when the mode signal has the second logic value, in order to generate the corresponding oscillating signal.

16. The reliability detection method of claim 15, wherein when the mode signal has the second logic value, the plurality of oscillator circuits do not generate the plurality of oscillating signals in response to the switching signal.

17. The reliability detection method of claim 14, further comprising:

stopping outputting the detection signal when the mode signal has the first logic value.

18. The reliability detection method of claim 14, wherein generating the plurality of enable signals according to the mode signal comprises:

generating a plurality of control signals according to a selection signal; and generating, by a plurality of logic gate circuits, the plurality of enable signals according to the plurality of control signals and the mode signal, wherein when the mode signal has the first logic value, each of the plurality of enable signals has the second logic value.

19. The reliability detection method of claim 18, wherein each of the plurality of logic gate circuits is an AND gate circuit having an inverting input terminal, and the inverting input terminal is configured to receive the mode signal.

20. The reliability detection method of claim 14, wherein outputting the detection signal according to the plurality of oscillating signals when the mode signal has the second logic value comprises:

generating a signal according to the plurality of oscillating signals;

outputting the detection signal according to the signal when the mode signal has the second logic value; and stopping outputting the detection signal when the mode signal has the first logic value.

* * * * *